United States Patent [19]
Hause et al.

[11] Patent Number: 6,090,694
[45] Date of Patent: Jul. 18, 2000

[54] LOCAL INTERCONNECT PATTERNING AND CONTACT FORMATION

[75] Inventors: Fred N. Hause; Charles E. May, both of Austin; Mark I. Gardner, Cedar Creek, all of Tex.

[73] Assignee: Advanced Micro Devices, Inc., Sunnyvale, Calif.

[21] Appl. No.: 08/991,742

[22] Filed: Dec. 16, 1997

[51] Int. Cl.[7] .................................................. H01L 21/44
[52] U.S. Cl. ........................................ 438/597; 438/952
[58] Field of Search ..................................... 438/597, 619, 438/717, 952

[56] References Cited

U.S. PATENT DOCUMENTS

| | | | |
|---|---|---|---|
| 4,820,611 | 4/1989 | Arnold, III et al. | 430/271 |
| 5,464,790 | 11/1995 | Hawley | 437/60 |
| 5,525,542 | 6/1996 | Maniar et al. | 437/186 |
| 5,545,588 | 8/1996 | Yoo | 438/952 |
| 5,559,055 | 9/1996 | Chang et al. | 437/195 |
| 5,702,981 | 12/1997 | Maniar et al. | 437/192 |
| 5,763,327 | 6/1998 | Blasingame et al. | 438/717 |
| 5,880,018 | 3/1999 | Boeck et al. | 438/619 |

*Primary Examiner*—John F. Niebling
*Assistant Examiner*—Walter L. Lindsay, Jr.

[57] ABSTRACT

A method for forming a semiconductor device to produce a more distortion free via for interconnecting levels within a device or forming a connection between an external surface and an internal layer within a device includes the step of substituting a material similar to an etch stop adjacent one of the layers for the ARC. In other words, an etch stop is placed over the metal layer formed on a layer within the device. This is followed by a layer of silicon dioxide ($SiO_2$) and then by a layer of material similar to the etch stop. Photoresist is placed on the layer of material similar to etch stop. The photoresist is exposed to light to form the location of the vias. The layer of material similar to etch stop, and the $SiO_2$ layer are then removed in separate etching steps to form the via pathway from the resist to the etch stop adjacent the metal of the layer selected to be interconnected by the via. The resist can then be removed. This leaves the material similar to the etch stop located adjacent one surface of the $SiO_2$ layer, and leaves the etch stop covering the metal in the via opening. One etch step can now be used to remove the etch stop covering the metal in the via opening and to remove the material similar to the etch stop located on the $SiO_2$.

16 Claims, 12 Drawing Sheets

LOCAL INTERCONNECT PATTERNING AND CONTACT FORMATION

FIELD OF THE INVENTION

The present invention relates generally to integrated circuit manufacturing and more particularly to forming insulated gate field effect transistors.

BACKGROUND OF THE INVENTION

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the substrate. The gate is separated from the semiconductor substrate by a thin insulating layer such as a gate oxide. The operation of the IGFET involves application of an input voltage to the gate, which sets up a transverse electric field in the channel in order to modulate the longitudinal conductance of the channel.

In typical IGFET processing, patterning is used extensively to build various layers of devices which ultimately form the chip or die. For example, the source and drain on an individual IGFET are formed by introducing dopants of second conductivity type (P or N) into a semiconductor substrate of first conductivity type (N or P) using a patterned gate as a mask. Other devices on other layers are also constructed using patterning formed by placing a photoresist on the structure and then exposing portions of the photoresist to light. A mask is used to mask off parts of the light and to form the necessary patterns on the photoresist. The portion of the photoresist exposed to light may be either removed (positive photomasking) or the unexposed portion may be removed (negative photomasking). The images formed using a mask are very small. For example, some signal carrying lines formed with masks are 0.15 microns or less.

The resolution of small images is affected by several conditions on the wafer surface. Reflections off the surface layers, increasing variation of the topography, and the etching of multilayer stacks all require special process steps.

The high-intensity exposing radiation used to expose the photoresist ideally is directed at a 90° angle to the wafer surface. When this ideal situation exists, exposing waves reflect directly up and down in the resist, leaving a well-defined exposed image. In reality, some of the exposing waves are traveling at angles other than 90° and expose unwanted portions of the resist.

This subsurface reflectivity varies with the surface layer material and the surface smoothness. Metal layers, especially aluminum and aluminum alloys, have higher reflectivity properties. A goal of the deposition processes is a consistent and smooth surface to control this form of reflection.

Reflection problems are intensified on wafers with many steps, also called a varied topography. The sidewalls of the steps reflect radiation at angles into the resist, causing poor image resolution. A particular problem is light interference at the step that causes a "notching" of the pattern as it crosses the step.

Anti-reflective coatings (ARCs) spun onto the wafer surface before the resist can aid the patterning of small images. The ARC layer brings several advantages to the masking process. First is a planarizing of the surface, which makes for a more planarized resist layer. Second, an ARC cuts down on light scattering from the surface into the resist, which helps in the definition of small images. An ARC can also minimize standing wave effects and improve the image contrast. The latter benefit comes from increased exposure latitude with a proper ARC.

An ARC is spun onto the wafer and baked. After the resist is spun on top of the ARC, the wafer is aligned and exposed. The pattern is developed in both the resist and the ARC. During the etch, the ARC acts as an etch barrier. To be effective, an ARC material must transmit light in the same range as the resist. It must also have good adhesion properties with the wafer surface and the resist. Two other requirements are that the ARC must have a refractive index that matches the resist, and that the ARC must develop and be stripped with the same chemicals as the resist.

There are several penalties associated with the use of an ARC. One is an additional layer requiring a separate spin and bake. The resolution gains offered by an ARC can be offset with poor thickness control and/or with an ill-controlled developing step. The time of exposure can increase 30 to 50 percent, increasing the wafer throughput time.

Typically there is a need to connect between layers or form a connection between an exterior surface of a chip or die and a semiconductor within the device. A structure called a via is formed for interconnecting layers or one device or portion internal to the chip and an external surface. A via is a vertical opening filled with conducting material used to connect circuits on various layers of a device to one another and to the semiconducting substrates. Structures formed will typically include one or more vias for interconnecting the various layers of a device. Contacts are vias that form an electrical path to a layer within the device. A layer of devices is typically covered with an etch stop layer of $S_iN$ or $S_iON$. A layer of silicon dioxide ($SiO_2$) or a dielectric layer is then placed over the etch stop layer. A dielectric is a material that conducts no current when it has a voltage placed across it. The dielectric insulates one layer from another layer, or if it is the final layer, the dielectric passivates the top layer of the device formed.

In forming vias for either interconnecting layers within a device or for producing contacts from within the device or chip to an external surface, there are several problems that occur with the current methods for forming a via. After an anti-reflective coating is laid down and baked on, photo resist is placed on the surface of the chip and exposed. Either the unexposed or exposed photoresist is removed (depending upon whether its a positive or negative photoresist) leaving an opening in the photoresist where a via will be formed. Each layer must then be removed through the opening to form a via using a separate etching step. In other words, the ARC must be removed first, then the $SiO_2$, then the etch stop must then be removed to form a passageway through each of the layers and down to the layer or point to which to connect within the chip. The resist and the ARC, which are the two upper layers or layers most distant from the layer to which to connect, are also removed in separate etching steps. As can be seen, forming a set of vias for a layer requires a number of steps.

In semiconductor fabrication, there is always a need for a process that uses less steps to accomplish the same task. Less steps not only simplifies the process but also provides for less chance for error and therefore improves the reliability of the finished product. In addition, there is a need for a process that lessens the distortion associated with current processing steps. Distortion results in less accurate electrical connection lines formed within a device.

SUMMARY OF THE INVENTION

A method for forming a semiconductor device to produce a more distortion free via for interconnecting levels within a device or forming a connection between an external surface and an internal layer within a device includes the step of substituting a material similar to an etch stop adjacent one of the layers for the ARC. In other words, an etch stop is placed over the metal layer formed on a layer within the device. This is followed by a layer of silicon dioxide ($SiO_2$) and then by a layer of material similar to the etch stop. Photoresist is placed on the layer of material similar to etch stop. The photoresist is exposed to light to form the location of the vias. The layer of material similar to etch stop, and the $SiO_2$ layer are then removed in separate etching steps to form the via pathway from the resist to the etch stop adjacent the metal of the layer selected to be interconnected by the via. The resist can then be removed. This leaves the material similar to the etch stop located adjacent one surface of the $SiO_2$ layer, and leaves the etch stop covering the metal in the via opening. One etch step can now be used to remove the etch stop covering the metal in the via opening and to remove the material similar to the etch stop located on the $SiO_2$.

Advantageously, one etch step can be used to remove two layers rather than the two separate steps used before. This improves the patterning and manufacturing process without adding complexity. Either a wet or dry etching process can be used to remove these two layers. In addition, improved lithography is achieved in using this process. It improves the patterning process by enabling an ARC layer so that the process is less sensitive to variation. The ARC layer cuts down on light scattering from the surface into the resist which helps the definition of small images.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENT

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Figure 1A:
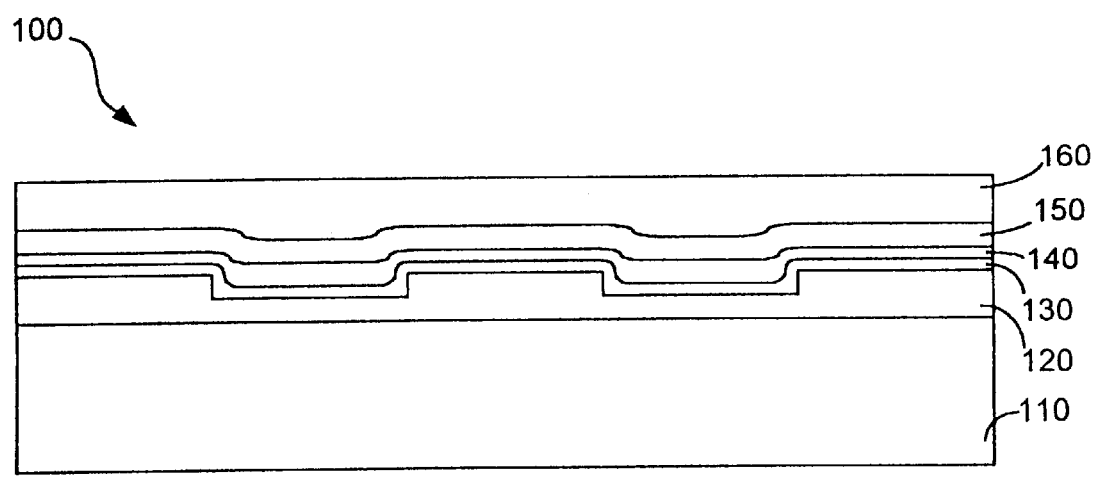
FIGS. 1A–1H show cross-sectional views of successive process steps for making a via in an IGFET using an organic ARC.

Described first is a semiconductor device which includes at least two transistors. Typically, a plurality of metal on silicon field effect transistors ("MOSFETs") are formed on a single layer and are then interconnected by a layer of patterned metal. FIG. 1A shows a device 100 which has a substrate 110, a layer of transistors 120 and a metal interconnect layer 130 for connecting the various transistors of the layer 120. The metalized layer 130 is formed in patterns so that certain or selected transistors in the layer 120 can be interconnected. An etch stop layer 140 is placed on the metal interconnect layer 130. The etch stop layer is formed of $S_iN$ or $S_iON$. These are two of the common materials used for etch stop. A dielectric layer 150 is placed on top the etch stop layer. The dielectric used is typically silicon dioxide ($S_iO_2$). An organic anti-reflective coating (ARC) is then added to the device. The anti-reflective coating is an organic substance that is spun onto the dielectric surface or layer 150. The organic ARC planarizes the surface of the device 100. Therefore the ARC layer 160 is shown with an essentially flat topography.

Figure 1B:
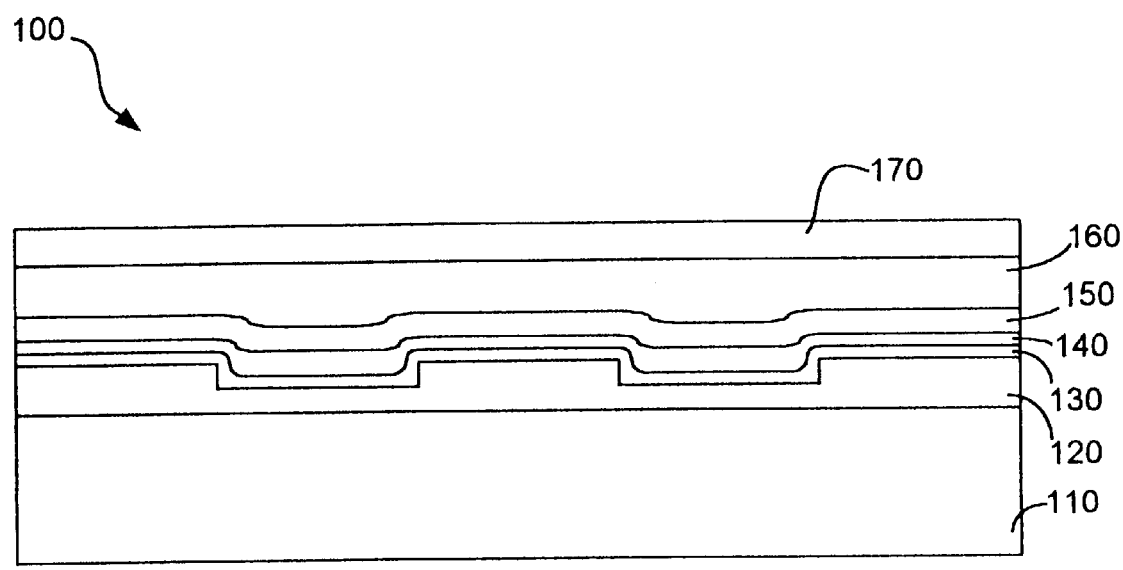
Figure 1C:
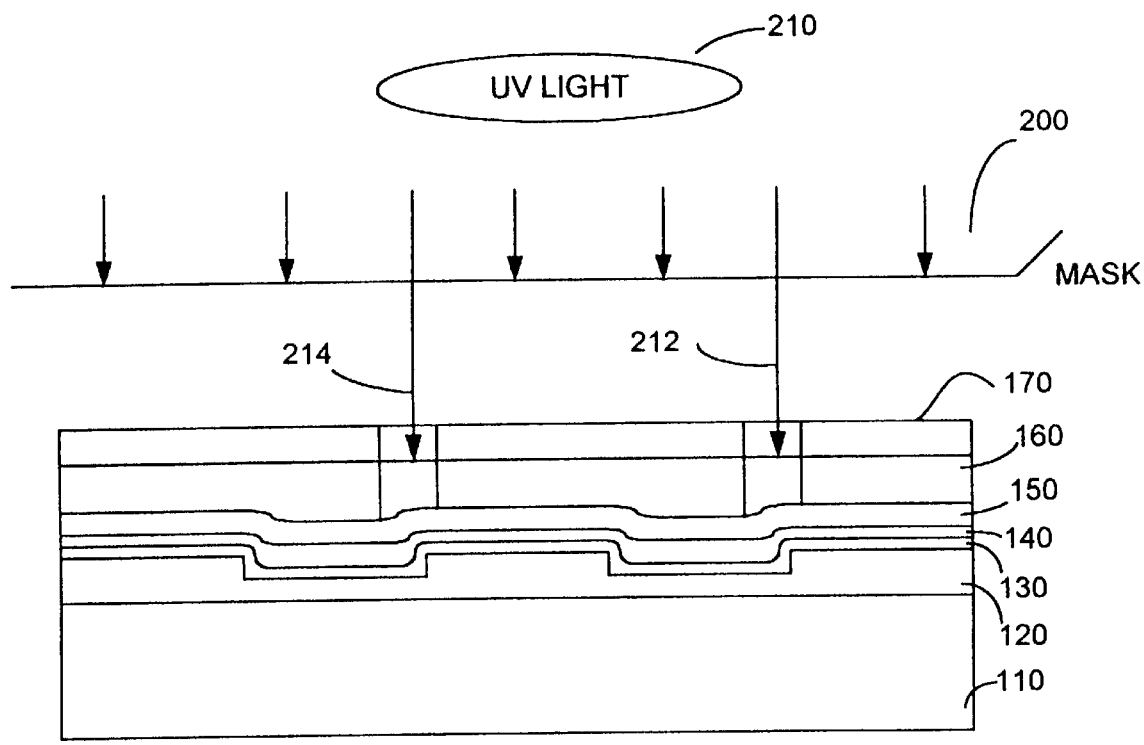

In order to form a via, a layer of photoresist 170 is spun onto a wafer. As shown in FIG. 1B the photoresist 170 is adjacent or placed on top of the organic ARC layer 160. A mask 200 is then placed between a UV light source 210 and the device 100. The mask has an opening therein and is used to selectively expose the device 100 to UV light as depicted by the arrows 212 and 214. The photoresist 170 and the ARC layer 160 are then exposed to the UV light. The exposed portion can then be removed by developing the photoresist. It should be noted that a positive photoresist process is described here; however, a negative photoresist property could be used also.

Figure 1D:
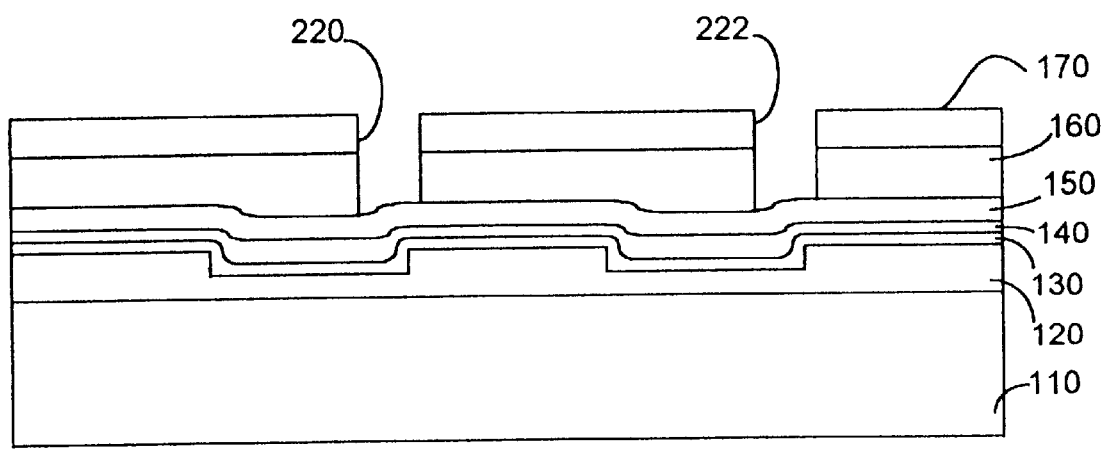
Figure 1E:
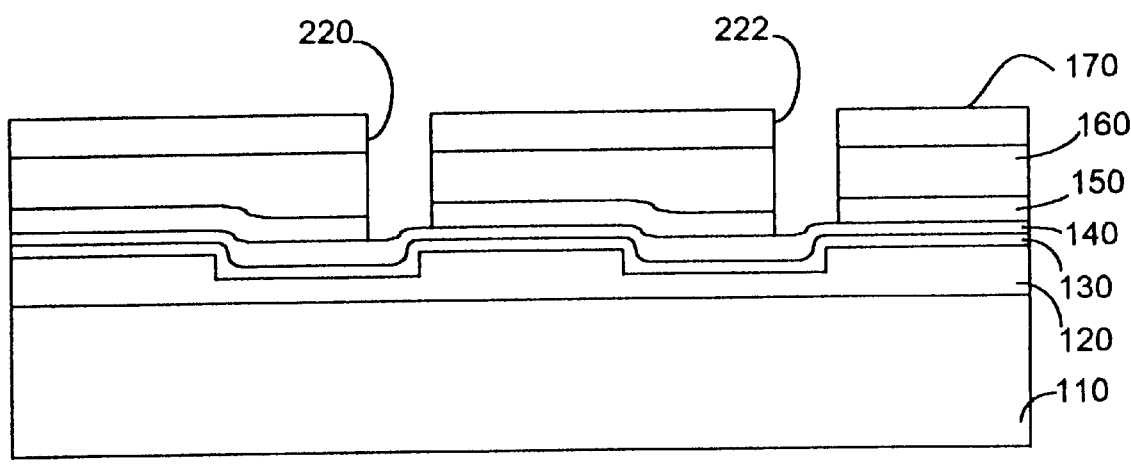

As shown in FIG. 1D the result of developing the photoresist layer 170 and the ARC layer 160 is the formation of a first via opening 220 and a second via opening 222. A wet or dry etch process is applied to the dielectric layer 150.

Figure 1F:
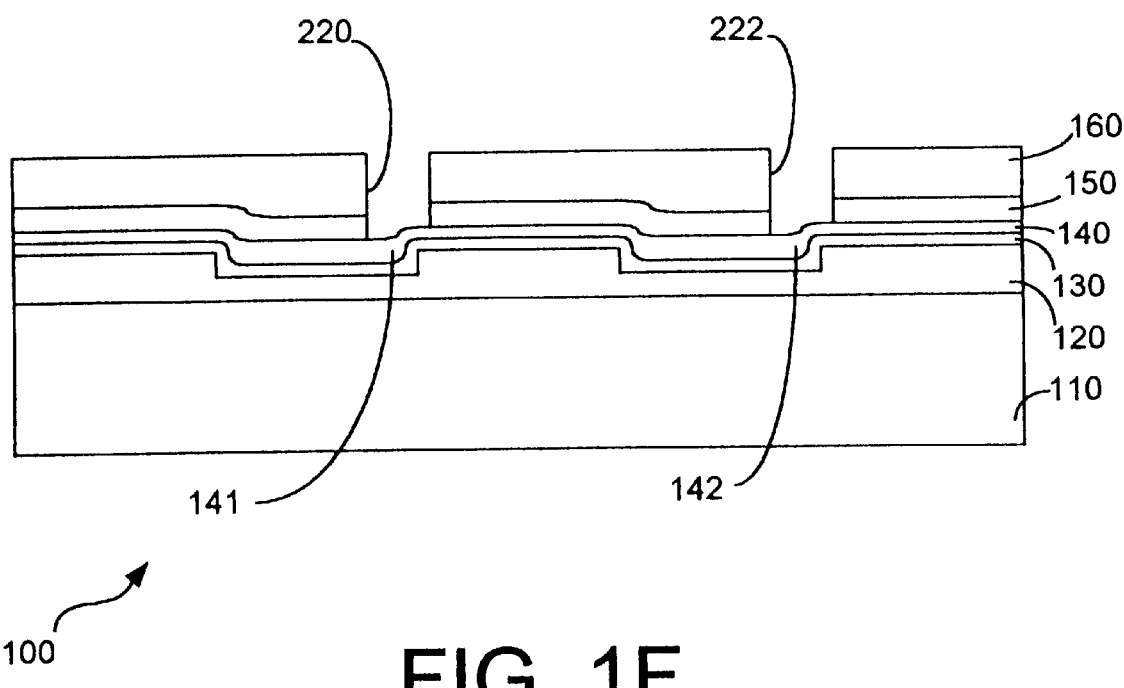

FIG. 1F shows that the resist layer 170 is removed using a separate process step. Wet or dry etching may be used to remove the resist layer 170. The ARC layer 170 is used as a hard mask for pattern transfer. As shown in FIG. 1F, each of the openings 220 and 222 extends through the organic ARC 160 and the dielectric layer 150. The bottom of each of the openings 220 and 222 includes an etch stop layer 140. To complete the via, the openings 220 and 222 must be extended through the etch stop layer 140, and the ARC layer 160 must be removed. When an organic ARC 160 is used, the ARC 160 is removed in one step and the etch stop at the bottom of the openings 220 and 222 is removed in a separate process step. The etch stop at the bottom of opening 220 is denoted by the reference numeral 141 and the etch stop at the bottom of the opening 222 is denoted by the reference numeral 142.

Figure 1G:
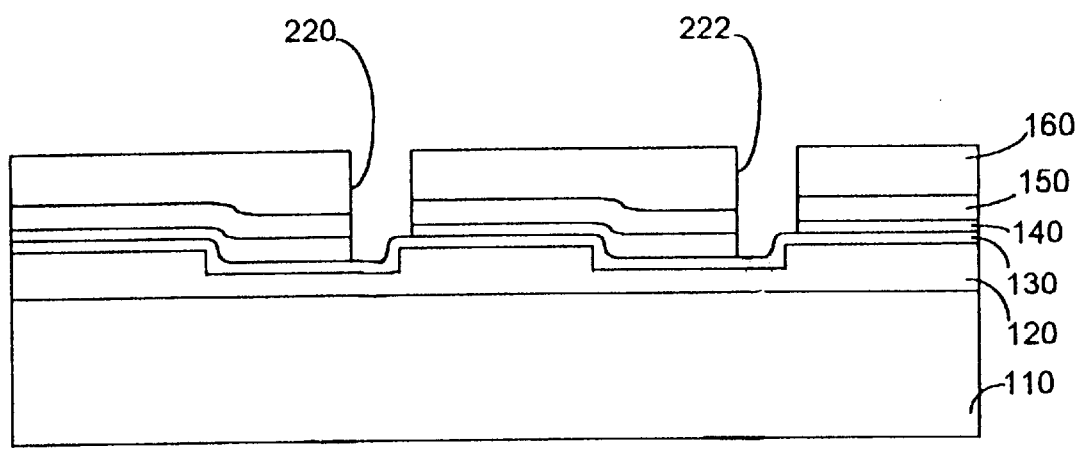
Figure 1H:
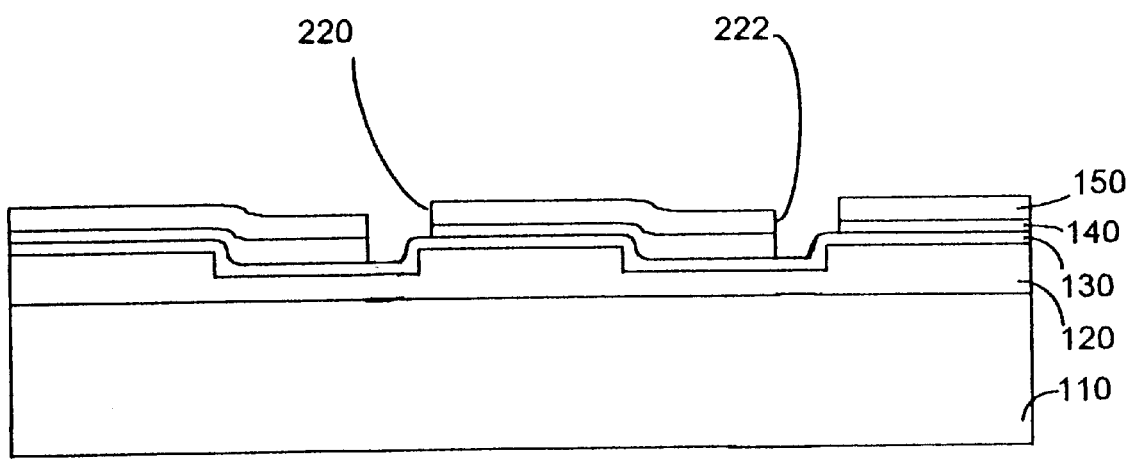

FIG. 1G shows the end result of the etch stop portions 141 and 142 being removed from the openings 220 and 222. The end result is that the vias or via openings 220 and 222 extend through the organic ARC layer 160, the dielectric layer 150 and the etch stop layer 140 to the metal interconnect layer 130. As shown in FIG. 1H, the ARC layer 160 is removed in a separate step from removing the etch stop 141 and 142. This is the structure that results. Further processing steps include plugging the via openings 220 and 222 with metal. This brings the metal up from the interconnect metal layer 130 to the exterior surface of the device 100. As described thus far, the organic anti-reflective coating or ARC layer 160 and the portions of the etch stop layers 140 and 142 are removed in separate steps. There is always a need to combine steps in the formation of a semi-conductor.

Rather than select an organic anti-reflective coating or ARC layer 160, a material similar to the etch stop layer 140 is substituted for the material comprising the ARC layer 160.

Figure 2A:
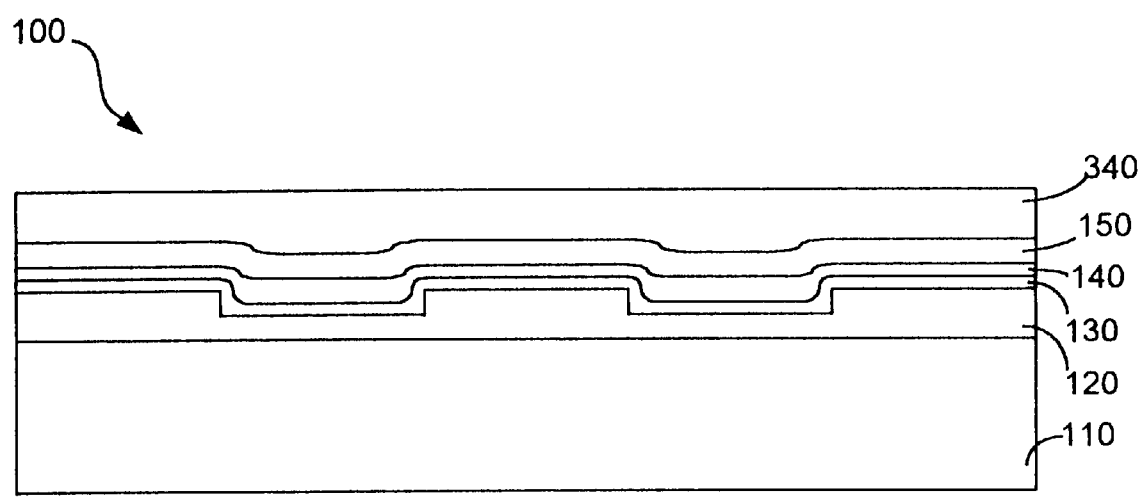
FIGS. 2A–2C show cross-sectional views of successive process steps for making an IGFET with an ARC layer of material similar to the etch stop in accordance with an embodiment of the invention.
Figure 2B:
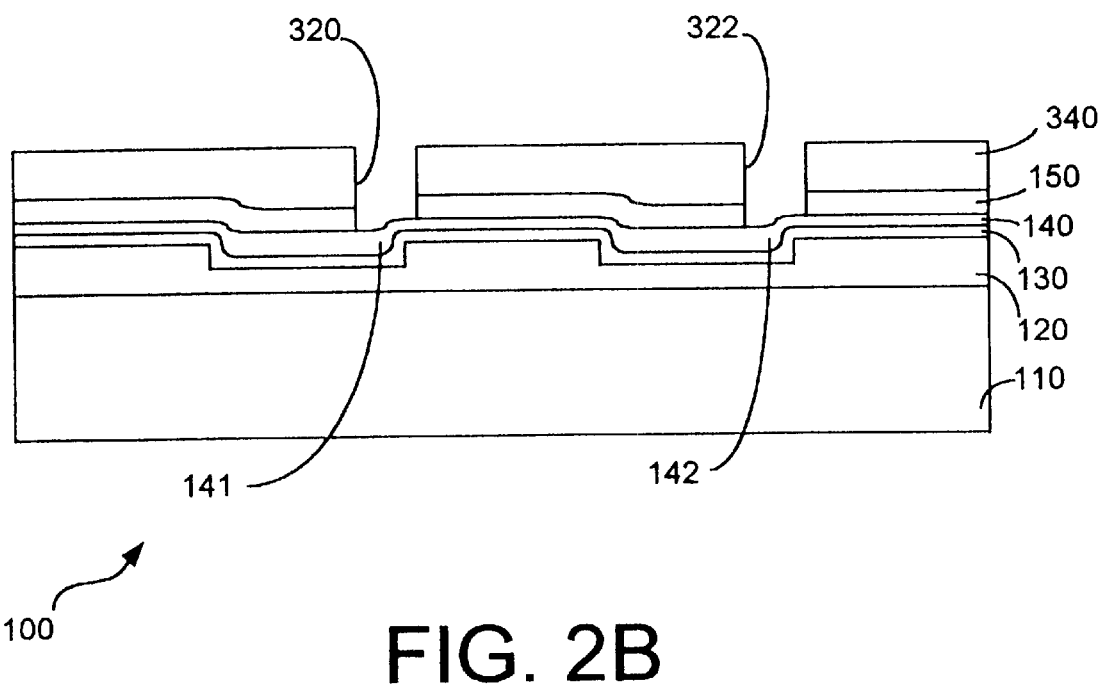

Now turning to FIG. 2A, the device shown includes a substrate 110, a layer of individual transistors 120, a metal interconnect layer 130, an etch stop layer 140, a silicon dioxide or dielectric layer 150, and an ARC layer 340 made of a material similar to the etch stop 140. The processing steps used to form vias 320 and 322 are essentially the same as the processing steps described above with respect to FIGS. 1B to 1E. The result of these processing steps is the structure shown in FIG. 2B in which the via openings 320 and 322 extend past the layer 340 and past the dielectric layer 150 and to the etch stop layer 140. Specifically, at the bottom of each of the openings 320 and 322 are portions of the etch stop layer 141 and 142. It should be noted now that the material forming the etch stop layer 140 and the portions of the etch stop layer 141 and 142 are the same or similar to the material forming the ARC layer 340. Now, with a single processing step such as a liquid or dry etch, the portions 141 and 142 of the etch stop layer 140, as well as the ARC layer 340 made of a material similar to the etch stop can be removed substantially simultaneously in a single processing step. The material 340 can either be the same as the material comprising the layer 140. Two common materials might be silicon nitrate ($S_iN$) or $S_iON_2$. These two materials are commonly used as etch stops. The material 340 and the material of the etch stop layer 140 can also be different materials. If the ARC material 340 is different than the material comprising the etch stop 140, a single processing step for removing a material must be effective on both the etch stop layer 140 and the ARC layer 340.

Figure 2C:
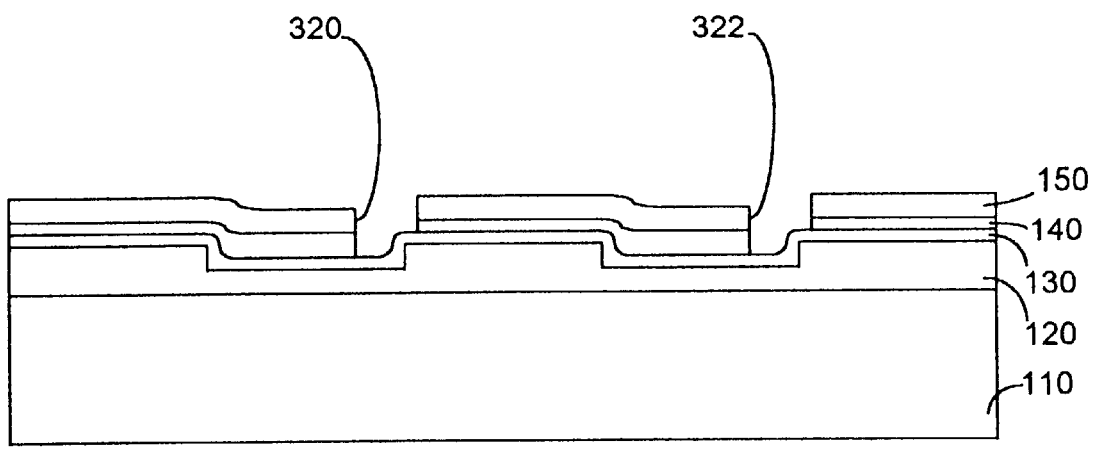

FIG. 2C shows the structure of the device 100 after the ARC layer 340 and the portions of the etch stop layer 141 and 142 have been removed. The end result is a structure in which the via openings 320 and 322 extend past the dielectric layer 150 and the etch stop 140 and extend to the metal interconnect layer 130. The remaining processing steps is that the via openings 320 and 322 are plugged with a conductive metal to provide a via which connects to the metal interconnect layer 130.

The present invention includes numerous variations to the embodiment described above. For instance, the gate insulator and spacers and can be various dielectrics including silicon dioxide, silicon nitride and silicon oxynitride. In addition, this invention is equally applicable to devices forming PNP type IGFETS and NPN type IGFETS.

Figure 3:
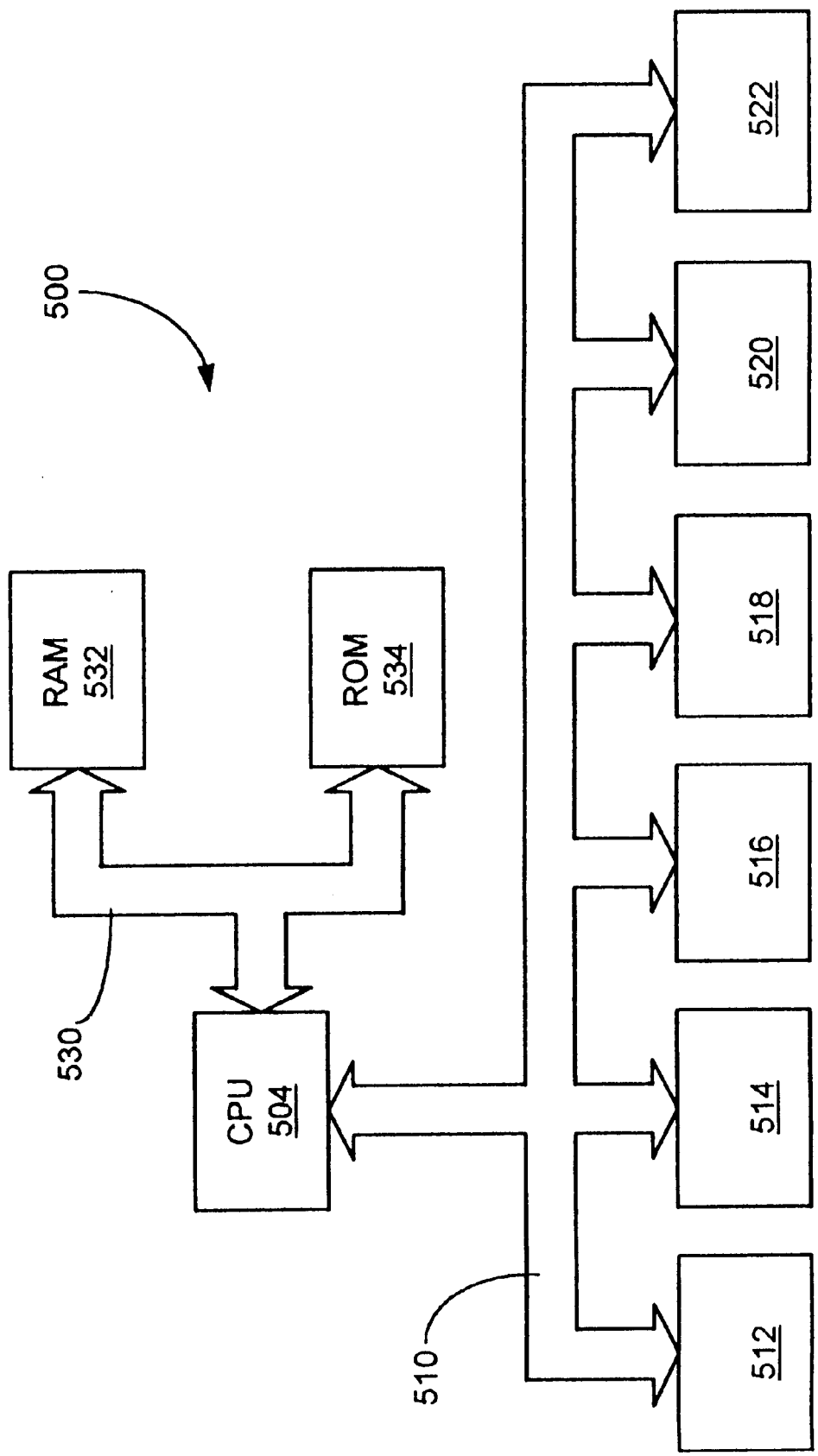
FIG. 3 is a schematic of an information handling system.

Advantageously, the invention is well-suited for use in a device such as an integrated circuit chip, as well as an electronic system including a central processing unit, a memory and a system bus. The electronic system may also be an information handling system 500 as shown in FIG. 3. The information handling system includes a central processing unit 504, a random access memory 532, and a system bus 530 for communicatively coupling the central processing unit 504 and the random access memory 532. The information handling system 500 includes a device formed by the steps shown in FIG. 2A–2C, as described above. The system 500 may also include an input/output bus 510 and several devices peripheral devices, such as 512, 514, 516, 518, 520, and 522 may be attached to the input output bus 510. Peripheral devices may include hard disk drives, floppy disk drives, monitors, keyboards and other such peripherals.

Although specific embodiments have been illustrated and described herein, it is appreciated by those of ordinary skill in the art that any arrangement which is calculated to achieve the same purpose may be substituted for the specific embodiments shown. This application is intended to cover any adaptations or variations of the present invention. Therefore, it is manifestly intended that this invention be limited only by the claims and the equivalents thereof.

What is claimed is:

1. A method of forming a device, said method comprising the steps of:
    applying an etch stop material over a metal interconnecting layer;
    applying a dielectric layer over the etch stop material layer;
    applying an anti-reflective coating over the dielectric layer;
    forming a via opening in the device that includes removing the etch stop material adjacent the metal layer and the anti-reflective coating covering the dielectric layer substantially simultaneously using an etch chemistry that is effective in etching both the etch stop material and the anti-reflective coating; and
    filling the via opening with metal to form a via.

2. The method of claim 1 wherein the step of applying the first etch stop material over the metal layer includes applying a layer of SiN.

3. The method of claim 2 wherein the step of applying the anti-reflective coating over the dielectric layer includes applying a layer of SiN.

4. The method of claim 1 wherein the step of applying the first etch stop material over the metal layer includes applying a layer of SiON.

5. The method of claim 4 wherein the step of applying anti-reflective cating over the dielectric layer includes applying a layer of SiON.

6. A method for forming a via within a device, said method comprising the steps of:
    applying a layer of a first material over a metal layer;
    applying a layer of a second dielectric material over the first material;
    applying a layer of a third material over the dielectric layer; and
    forming a structure having an opening to be used as a via for connecting to the metal layer, said step of forming a structure having an opening including the step of removing the first material to provide a bottom of the opening and removing the third material substantially simultaneously using the same etch chemistry.

7. The method of claim 6 wherein the step of removing the first material and the third material is done by dry etching.

8. The method of claim 6 wherein the step of removing the first material and the third material is done by wet etching.

9. The method of claim 6 wherein the first material and the second material have similar properties such that each is removable using a single processing step, and wherein the first and third material are different from one another.

10. The method of claim 9 wherein one of the first material or the second material is SiN.

11. The method of claim 9 wherein one of the first material or the second material is SiON.

12. The method of claim 9 wherein at least one of the first material or the second material is an etch stop material.

13. The method of claim 9 wherein the first material and the second material are an etch stop material.

14. The method of claim 1 wherein the etch stop material and the anti-reflective coating are different from one another.

15. The method of claim 1 wherein the etch stop material and the anti-reflective coating are composed of the same material.

16. The method of claim 6 wherein the first and third material are composed of the same material.

* * * * *